United States Patent
Shakuda

[11] Patent Number: 5,825,052
[45] Date of Patent: Oct. 20, 1998

[54] SEMICONDUCTOR LIGHT EMMITTING DEVICE

[75] Inventor: Yukio Shakuda, Kyoto, Japan

[73] Assignee: Rohm Co., Ltd., Kyoto, Japan

[21] Appl. No.: 515,569

[22] Filed: Aug. 16, 1995

[30] Foreign Application Priority Data

Aug. 26, 1994 [JP] Japan ................................ 6-202476
Aug. 26, 1994 [JP] Japan ................................ 6-202477

[51] Int. Cl.$^6$ .................................................. H01L 33/00
[52] U.S. Cl. ........................ 257/94; 257/607; 257/742; 257/103
[58] Field of Search ............................ 257/94, 102, 607, 257/615, 742, 744, 103

[56] References Cited

U.S. PATENT DOCUMENTS

| | | | |
|---|---|---|---|
| 3,987,480 | 10/1976 | Diguet et al. ............................ | 257/744 |
| 4,746,964 | 5/1988 | Aronowitz ................................ | 257/607 |
| 4,792,467 | 12/1988 | Melas et al. ............................. | 427/255 |
| 5,173,751 | 12/1992 | Ota et al. .................................. | 257/103 |
| 5,274,251 | 12/1993 | Ota et al. .................................. | 257/103 |
| 5,389,799 | 2/1995 | Uemoto .................................... | 257/607 |
| 5,434,698 | 7/1995 | Takano et al. ............................ | 257/451 |
| 5,563,422 | 10/1996 | Nakamura et al. ....................... | 257/13 |

OTHER PUBLICATIONS

IBM Technical Disclosure Bulletin, vol. 15, No. 2, p. 471 Jul. 1972 by Blum et al.

*Primary Examiner*—Mark V. Prenty
*Attorney, Agent, or Firm*—Nikaido, Marmelstein, Murray & Oram LLP

[57] ABSTRACT

A semiconductor light emitting device comprising: a substrate; and a gallium nitride type compound semiconductor layers provided on the substrate, the semiconductor layers including at least an N-type layer and a P-type layer; wherein an N-type side electrode connected to a gallium nitride type compound semiconductor of the N-type layer and a P-type side electrode connected to a gallium nitride type compound semiconductor of the P-type layer are provided, wherein the dopant for the gallium nitride type compound semiconductor layer of the P-type layer is Be.

8 Claims, 4 Drawing Sheets

SEMICONDUCTOR LIGHT EMMITTING DEVICE

BACKGROUND OF THE INVENTION

The present invention relates to a semiconductor light emitting device, and more particularly to a semiconductor light emittting device using a gallium nitride type compound semiconductor suitable for blue-color emission.

In this specification a gallium nitride type compound semiconductor refers to a semiconductor composed of a compound which is formed by combining Ga of Group III element with N of Group V element, or said semiconductor being formed by replacing part of Ga of Group III element with another Group III element such as Al and In, and/or formed by replacing part of N of Group V element with another Group V element such as P and As.

Also, a semiconductor light-emitting device refers to a semiconductor element emitting light such as a light emitting diode (hereinafter called an LED) having double heterojunction including PN junction or pin, a super luminescent diode (SLD), or a semiconductor laser diode (LD).

Heretofore, a blue-color LED has had a lower luminance than that of red-color LED and green-color LED and thus had weakness for practical use. However, recently using a gallium nitride type compound semiconductor, a low electric resistant P-type semiconductor layer doped with Mg has been obtained, so that the blue-color LED has improved the luminance thereof and has been spot lighted.

Figure 4:
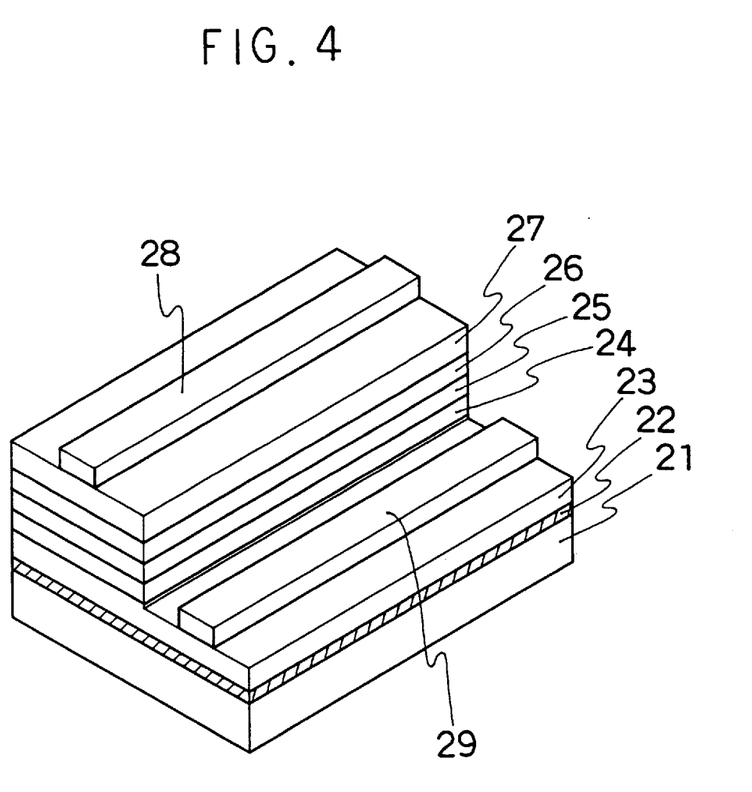
FIG. 4 is a perspective veiw showing one example of a conventional semiconductor light emitting device.

A conventional method of manufacturing a gallium nitride type compound semiconductor is performed in a process shown below and a perspective view of a completed gallium nitride type compound semiconductor is shown in FIG. 4.

Trimethyl gallium (hereinafter called TMG) as an organometallic compound gas, ammonia ($NH_3$) and $SiH_4$ and the like as a dopant together with carrier gas $H_2$ are supplied to a substrate 21 composed of sapphire (single crystal of $Al_2O_3$) at a low temperature of 400° C. to 700° C. by means of the metal organic chemical vapor deposit method (hereinafter called the MOCVD method) to form a low temperature buffer layer 22 composed of an N-type GaN layer, and then the same gas is supplied to the substrate at a high temperature of 700° C. to 1200° C. to form a high-temperature buffer layer 23 composed of the same composition of the N-type GaN layer.

Then, a raw gas of trimethyl aluminum (hereinafter called TMA) is further supplied to the above-mentioned gas to form an N-type $Al_xGa_{x-1}N$ (0<x<1) layer containing Si as an N-type dopant, thereby forming an N-type clad layer 24 for double heterojunction formation.

Then, a material which the band gap energy of which becomes smaller than that of the clad layer, for example, trimethyl indium (hereinafter called TMI) instead of the above-mentioned raw gas of TMA is introduced to form an active layer 25 composed of $Ga_yIn_{1-y}N$ (0<y≦1).

Further, using the same raw gas as used to form the N-type clad layer 24, dicycropentadienel magnesium (hereinafter called $Cp_2Mg$) or dimethyl zinc (hereinafter called DMZn) for Mg or Zn as a P-type impurity as an impurity raw gas instead of $SiH_4$ is added and introduced into a reactive tube to allow a P-type $Al_{xGax-1}N$ layer as a P-type clad layer 26 to be vapor deposited. This causes a double heterojunction to be formed by the N-type clad layer 24 and the P-type clad layer 26.

Then, to form a cap layer 27, using the same gas as for the above-mentioned buffer layer 23, $Cp_2Mg$ or $DMZ_n$ as an impurity raw gas is supplied to allow a P-type GaN layer to be deposited.

Thereafter, a protective film such as $SiO_2$ is provided on the entire surface of the deposit layer of the semiconductor layer, and annealing at 400° C. to 800° C. for about 20 to about 60 minutes is performed to activate the P-type clad layer 26 and the cap layer 27.

Then, after the protective film is removed, a resist is applied to perform patterning so as to form an electrode on the N-type side, and part of each deposited semiconductors removed by means of dry etching to allow the buffer layer 23 as an N-type GaN layer to be exposed. Then, a metallic film composed of Pt, Ni, Au and the like is formed by means of sputtering and the like to form a P-type side electrode 28, and a metallic film composed of Al and the like is formed by means of a similar method to form an N-type side electrode 29, and then dicing is performed to form LED chips.

Then, to make an ohmic contact between Al and the like as an electrode metal and the gallium nitride type compound semiconductor, heat treatment in $H_2$ atmosphere at about 300° C. is performed to effect alloying.

The semiconductor device using the conventional gallium nitride type compound semiconductor employs Mg or Zn as a P-type dopant and Si as an N-type dopant. However, these dopants each is easily dissoloved in GaN, so that carrier concentration cannot be increased to some extent. Further, there is such a problem that when annealing and the like are performed, dopants are apt to move and diffused with each other to eliminate the steep property of PN junction, or the position of PN junction is dislocated to increase operating voltage, or carrier leaks from a light emitting layer to produce a reactive current and thus lower light emitting efficiency.

Further, there is another problem that as an electrode, conventionally, Pt, Ni, Au and the like are used on the P-type side, but these are hardly reactive with Mg of P-type dopant, and Al and the like are used on the P-type side, but these are also hardly reactive with Si of N-type dopant, whereby a contact resistance between the electrode metal and the semiconductor layer becomes large, and the operating voltage of the light emitting device becomes high to cause light emitting efficiency to be lowered.

Also, in the semiconductor device using the conventional gallium nitride type compound semiconductor, as described above, the clad layers 24 and 26 employ an $Al_x Ga_{x-1}N$ layer doped with Si and Mg and the like, and the active layer 25 employs a non-doped $Ga_yIn_{1-y}N$ layer and the like, so that the band gap energy of the active layer 25 is made smaller than that of the clad layers 24 and 26 to utilize a light confining effect. Adding In to the active layer 25 allows the band gap energy to be made small, and the larger the composition ratio of In in the $Ga_yIn_{1-y}N$ layer becomes, the longer the wavelength of emitted light becomes. However, when the composition ratio of In becomes too large, lattice constant becomes largely different from GaN as a buffer layer to cause light emitting efficiency to be lowered, so that the limit of the composition ratio (1-y) of In is 0.2, and thus wavelength of emitted light cannot be made longer than about 480 nm.

For this reason, there is another problem that for the purpose of blue-color LED and green-color LED, a light having a wavelength of about 490 nm to about 520 nm longer than 480 nm is demanded, but a semiconductor light emitting device having such a wavelength cannot be obtained. Also, there is still another problem that where the composition ratio of In is increased to make the wavelength of emitted light longer, lattice mismathing becomes noticeable, so that the thickness of the active layer cannot be made thick even for a composition ratio of 0.2, and thus light emitting energy cannot be increased.

SUMMARY OF THE INVENTION

The present invention is made to solve the above-mentioned problems and increase carrier concentration, and it is an object of the invention to provide a semiconductor light emitting device operating on a low operating voltage.

Another object of the present invention is to provide a semiconductor light emitting device composed of a gallium nitride type compound semiconductor in which even when a heat treatment such as annealing is performed, the PN junction thereof is not dislocated or sagged to prevent carrier leakage and provide a stable light emitting property.

Still another object of the present invention is to provide a semiconductor light emitting device reducing a contact resistance between an electrode metal and a semiconductor layer to reduce operating voltage and thus improve light emitting efficiency.

Yet another object of the present invention is to provide a semiconductor light emitting device having a wide range of change in wavelength of emitted light regardless of the mixed crystal ratio of In.

The present invention is completed on the basis of a knowledge that a P-type dopant and an N-type dopant are selected and the most suitable dopants are used, whereby carrier concentration can be increased to reduce electric resistance loss, and a sagging of PN junction is prevented to reduce reactive current and thus improve light emitting efficiency; and that an electrode material is made an alloy material containing a dopant for semiconductor layer in contact with the electrode material to allow a contact resistnace between an electrode and a semiconductor material to be reduced.

A semiconductor light emitting device as set forth is the one in which gallium nitride type compound semiconductor layers having at least an N-type layer and a P-type layer are laminated on a substrate, and in which an N-type side electrode connected to the above-mentioned N-type layer and a P-type side electrode connected to the above-mentioned P-type layer are provided. Dopants for the N-type layer and the P-type layer are selected from various dopants such that in the invention, the dopant of the above-mentioned P-type layer is Be; that in the invention, the dopant of the above-mentioned P-type layer is Mn; that in the invention, the dopant of the N-type layer is Se or S; that in the invention, the dopant of the N-type layer is single kind of an element selected from a group composed of Ge, Te and Sn; that in the invention, the dopant of the above-mentioned P-type layer is at least two kinds of mixed elements selected from a group composed of Mg, Zn, Cd, Be and Mn; and that in the invention, the dopant of the above-mentioned N-type layer is at least two kinds of mixed elements selected from a group composed of Si, Ge, Sn, S, Se and Te.

The invention is a semiconductor light emitting device in which gallium nitride type compound semiconductor layers having at least an N-type layer and a P-type layer are laminated on a substrate, and in which an N-type side electrode and a P-type side electrode, respectively, connected to the above-mentioned N-type layer and P-type layer are provided, wherein an alloy containing at least one kind of an element of dopants of the N-type layer and the P-type layer, respectively, connected to the above-mentioned N-type side and/or P-type side electrode is used as the N-type side and/or P-type side electrode.

The invention is a semiconductor light emitting device in which gallium nitride type compound semiconductor layers containing at least an N-type layer and a P-type layer on a substrate and having a light emitting layer are laminated on a substrate, wherein at least the above-mentioned light emitting layer is composed of a compound semiconductor in which part of the nitrogen in the gallium nitride type compound semiconductor is replaced with phosphorus and/or arsenic.

In this specification, the light emitting layer refers to an active layer provided between clad layer, an LED of PN junction and the like, meaning a PN junction vicinity generating light by the coupling of electrons with positive holes.

The gallium nitride type compound semiconductor layers laminated on the above-mentioned substrate may have both N-type and P-type clad layers, and an active layer composed of a material which is provided between both the clad layers and which has a band gap energy smaller than that of both the clad layers, and the active layer may comprise a compound semiconductor in which part of the nitrogen in the gallium nitride type compound semiconductor is replaced with phosphorus and/or arsenic.

To make the wavelength of emitted light long, it is preferable that the above-mentioned active layer is a compound semiconductor in which part of the gallium in the gallium nitride type compound semiconductor is replaced with In.

To control the wavelength of emitted light, it is preferable that at least one kind of dopant selected from a group composed of Mg, Zn, Cd, Be, Ca, Mn, Si, Se, S, Ge and Te is doped in the above-mentioned active layer.

To control the wavelength of emitted light, it is preferable that an N-type dopant and a P-type dopant having the same amount are added to the above-mentioned active layer.

The gallium nitride type compound semiconductor layers laminated on the above-mentioned substrate may have a junction plane of an N-type layer and a P-type layer, and the N-type layer and/or the P-type layer may comprise a compound semiconductor in which part of the nitrogen in the gallium nitride type compound semiconductor is replaced with phosphorus and/or arsenic.

To make the wavelength of emitted light long, it is preferable that the above-mentioned N-type layer and P-type layer comprise compound semiconductors in which part of the gallium in the gallium nitride type compound semiconductor is replaced with Indium.

According to the invention, Be is used as a P-type dopant, and Be is an element lighter than Mg, so that a doping with a high concentration can be performed. As a result, the carrier concentration can be made higher to reduce an electric resistance between electrodes.

According to the invention, Mn is used as a P-type dopant, and Mn is an element lighter than Mg, so that Mn is hardly moved even by a eat treatment such as annealing a PN junction is not moved by diffusion, and thus exhibits less sagging.

According to the invention, Se or S is used as an N-type dopant, and is an element of Group VI, so that Se or S acts as the N-type dopant entered the position of N atom of GaN. As a result, a doping with a high concentration can be performed, so that the carrier concentration can be made higher to reduce an electric resistance between electrodes.

According to the invention, Ge, Sn or Te is used as an N-type dopant, and these elements are lighter than Si, so that these elements are hardly moved even by a heat treatment such as annealing and PN junction is not moved by diffusion, and thus exhibits less sagging. Particularly, Te is one of Group VI and heavier than S or Se, so that the carrier concentration can be made higher, and at the same time, the dislocation of PN junction can be prevented.

According to the invention, at least two kinds of elements each as a P-type dopant of an N-type dopant are doped, so that respective dopant properties can be combinedly provided such that the carrier concentration can be made higher, and at the same time, the dislocation of PN junction can be prevented, thereby causing a light emitting device composed of a high-performance gallium-nitride type compound semiconductor to be obtained.

According to the invention, an alloy containing at least one kind of an element of dopants of the gallium nitride type compound semiconductors of the N-type layer and the P-type layer, respectively, connected to the N-type side and/or the P-type side electrode is used in the N-type side and/or the P-type side electrode, and thus there is the same element in the electrodes and the above-mentioned gallium nitride type compound semiconductor, so that the electrode material and the semiconductor layer are apt to be alloyed, thereby allowing contact resistance to be reduced.

According to the invention, the active layer where the light emitting layer is of a double heterojunction, and the P-type layer and/or the N-type layer where the light emitting layer is of a PN junction comprise a compound semiconductor in which part of N of the gallium nitride type compound semiconductor is replaced with P and/or As, and P or As is an atom having a gallium compound energy band smaller than N, so that the light emitting layer emits a light having a longer wavelength.

The compound semiconductor in which part of N is replaced with P or As has a large reduction ratio of energy bandwidth than that of the compound semiconductor in which part of Ga is replaced with In, considering a change in lattice constant, so that a lattice matching with GaN, $Al_xGa_{x-1}N$ and the like is easily taken, thus allowing the film thickness of the light emitting layer (active layer) to be made thick and light emitting energy to be increased.

Adding a dopant to the above-mentioned active layer allows different light emitting levels to be developed in the energy band of a crystal, so that the wavelength of emitted light can be further made longer. Further, the combination of dopants allows the half-width of the spectrum of light emitting intensity with respect to wavelength of emitted light to be changed, and, for example, adding Zn and Se as a dopant causes the light emitting level as Ze, Se (not obtained by simple addition of Zn to Se) different from the light emitting level of individual dopant Zn and Se to be determined, thereby allowing wavelength of emitted light to be changed.

DETAILED DESCRIPTION

With reference to the attached drawings, a method of manufacturing a semiconductor light emitting device of the present invention will be explained hereinafter in detail.

EXAMPLE 1

FIGS. 2(a) through 2(d) are process cross-sectional illustrative views of one example of a semiconductor light emitting device of the present invention.

Figure 2A:
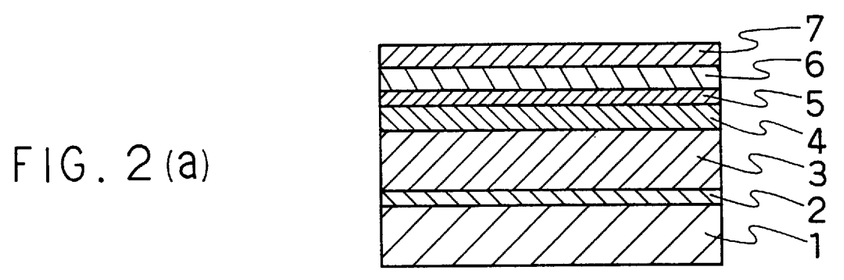
FIGS. 2(a) through 2(d) are views showing processes of manufacturing the LED of FIG. 1.

First, as shown in FIG. 2(a), a substrate 1 composed of sapphire and the like is placed in a reactive tube; together with carrier gas $H_2$, TMG at 150 sccm, $NH_3$ at 10000 sccm, and $SiH_4$ at 10 sccm which $SiH_4$ is diluted with $H_2$ as a dopant to have concentration of 100 ppm are introduced, and then by means of the MOCVD method, a low-temperature buffer layer 2 composed of a gallium nitride type compound semiconductor layer such as N-type GaN at 400° C. to 700° C. and a high temperature buffer layer 3 at 700° C. to 1200° C. are deposited by about 0.1 μm to about 0.2 μm and about 2 μm to about 5 μm, respectively.

Thereafter, TMA at a flow rate of 10 sccm to 100 sccm is further added to the above-mentioned gas to deposit N-type clad layer 4 composed of an N-type $Al_xGa_{x-1}N$ (0<x<1) by 0.1 μm to 0.3 μm, and then $SiH_4$ addition is stopped and instead of TMA, TMI at a flow rate of 10 sccm to 100 sccm is introduced to deposit an active layer 5 of 0.05 μm to 0.1 μm thickness, composed of a non-doped $Ga_yIn_{1-y}N$ which has a band gap energy smaller than the clad layer 4.

Further, using the same raw gas as used to form the N-type clad layer 4, bismethylcycropentadienel beryllium (hereinafter called $(MeCp)_2Be$) for Be as a P-type impurity as an impurity raw gas instead of $SiH_4$ is introduced into a reactive tube to allow a P-type clad layer 6 which is composed of $Al_xGa_{x-1}N$, and which contains Be having an impurity concentration of about $1 \times 10^{17}$ to about $1 \times 10^{19}/cm^3$ to be vapor deposited to 0.1 μm to 0.3 μm thickness.

Then, to form a cap layer 7, using the same gas as for the above-mentioned buffer layer 3, instead of $SiH_4$, $(MeCp)_2Be$ as an impurity raw gas is supplied to allow a P-type GaN layer to be deposited by about 0.3 μm to about 2 μm.

Figure 2B:
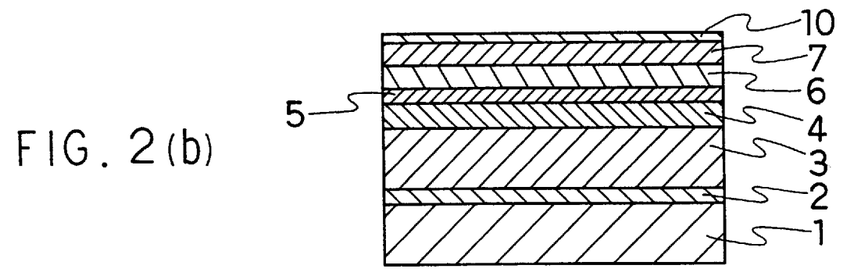

Thereafter, as shown in FIG. 2(b), a protective film 10 made of a material such as $SiO_2$ is provided on the entire surface of the deposit layer of the semiconductor layer, and annealing at 400° C. to 800° C. for about 20 to about 60 minutes is performed to activate the P-type clad layer 6 and the cap layer 7.

When the annealing is completed, the temperature is reduced to room temperature, and the protective film 10 is removed by means of wet etching.

Figure 2C:
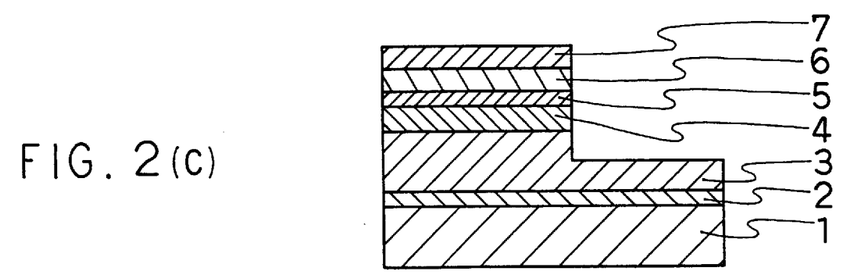

Then, a resist is applied to perform patterning so as to form an electrode on the N-type side, and as shown in FIG. 2(c), part of the gallium nitride type compound semiconductor layer is removed by means of dry etching to allow the buffer layer 3 as an N-type GaN layer to be exposed. Then, a P-type side electrode 8 composed of a metallic film made of a material such as Au and electrically connected to the P-type layer is formed on the surface of the deposited compound semiconductor layer by means of sputtering, and an N-type side electrode 9 composed of a metallic film made of a material such as Al and electrically connected to the N-type layer is formed on the surface of the exposed high temperature buffer layer 3 by means of sputtering (see FIG. 2(d)).

Then, dicing is performed for each chip to form LED chips.

According to this example, although an applied voltage required to flow a current of 20 mA has been conventionally 3.0 V, the voltage needs only 2.8 V to 2.9 V, thereby reducing power consumption.

EXAMPLE 2

In this example, Be used as a dopant in the P-type clad layer 6 and the cap layer 7 in the semiconductor light emitting device of Example 1 is replaced with Mn, and the other construction is the same as Example 1.

The P-type clad layer 6 and the cap layer 7 are formed in such a manner that instead of (MeCp)$_2$Be as a dopant gas of Example 1, Mn as a bismethylcycropentadienel manganese (hereinafter called (MeCp)$_2$Mn) gas at about 10 sccm to about 1000 sccm is introduced into a reactive tube to allow the P-type clad layer 6 which is composed of Al$_x$Ga$_{x-1}$N (0<x<1), and which contains Be having an impurity concentration of about 1×10$^{17}$ to about 1×10$^{19}$/cm$^3$ to be vapor deposited by about 0.1 μm to about 0.3 μm. The other manufacturing method is the same as Example 1.

It will be understood that according to this example, after annealing, in the layer having been originally not doped, a change in carrier concentration due to diffusion is small and no movement of PN junction occurs.

EXAMPLE 3

In this example, S is used instead of Si used as an N-type dopant in the N-type clad layer 4 and the buffer layers 2 and 3, and the other construction is the same as Example 1. Se or S, when used as a dopant, is diluted with H$_2$ as hydrogen selenide (H$_2$Se) of H$_2$S gas, respectively, and a gas having a concentration of 100 ppm at about 1 sccm to about 100 sccm is added and introduced into a reactive tube to allow the buffer layers 2 and 3 composed of the GaN layer and the N-type Al$_x$Ga$_{x-1}$N (0<x<1) layer as the N-type clad layer 4 to be vapor deposited so that impurity concentration thereof becomes about 1×10$^{17}$ to about 1×10$^{19}$/cm$^3$.

Also, although the P-type clad layer 6 as the P-type Al$_x$Ga$_{x-1}$N (0<x<1) layer and the cap layer 7 as the P-type GaN layer have employed the same Mg as used conventionally, Be or Mn used in Example 1 or 2 may be used.

According to this example where Mg is used for the P-type dopant and Se or S used for the N-type dopant, in comparison to the conventional semiconductor light emitting device where Si is used as an impurity of the N-type clad layer 4, and where an applied voltage required to obtain a current of 20 mA has been conventionally 3.0 V, the voltage needs only 2.8 V to 2.9 V, thereby reducing power consumption.

EXAMPLE 4

In this example, Ge, Sn or Te instead of the N-type impurity Se or S is used in the semiconductor light-emitting device of Example 3, and the other construction is the same as Example 3. To dope the dopants Ge, Sn and Te, monogermane (GeH$_4$) gas, hydrogenated tin (SnH$_4$) gas and tellurium hydrogen (TeH$_4$) gas, respectively, each of which is diluted with H$_2$ to have a concentration of 100 ppm are added at about 1 sccm to about 100 sccm and introduced into a reactive tube to allow the Al$_x$Ga$_{x-1}$N (0<x<1) layer as the N-type clad layer 4 to be vapor deposited so that the impurity concentration becomes about 1×10$^{17}$ to about 1×10$^{19}$/cm$^3$, as with the above-mentioned Example 3.

As with the above-mentioned Example 3, the dopant of the P-type Al$_x$Ga$_{x-1}$N (0≦x<1) layer as the P-type clad layer 6, and of the cap layer 7 may employ Be or Mn instead of Mg.

EXAMPLE 5

In this example, the dopant of the P-type clad layer 6 of the semiconductor light-emitting device in Example 1 employs at least two kinds of metals among Mg, Zn, Cd, Be or Mn instaed of Be, and the element other construction is the same as Example 1.

For example, when Be and Mn as respective raw gases (MeCp)$_2$Be at 10 sccm to 1000 sccm and (MeCp)$_2$Mn at 10 sccm to 1000 sccm are introduced to allow vapor deposit, under the condition that the amount of Be is equal to that of Mn in accordance with a molar conversion of the raw gas both of which are deposited on the substrate, Be and Mn are doped into the semiconductor layer by the same amount to allow the P-type clad layer 6 which is composed of Al$_x$Ga$_{x-1}$N (0≦x<1) and into which Be and Mn having an impurity concentration of about 1×10$^{17}$ to about 1×10$^{19}$/cm$^3$ are doped to be vapor deposited.

In this example, at least two kinds of impurity raw gases are introduced into the P-type clad layer 7, so that in comparison to a case where one kind of impurity raw gas is introduced, carrier concentration becomes higher and PN junction having a steep property is obtained, which are effective particularly to the semiconductor light-emitting having PN junction.

EXAMPLE 6

In this example, at least two kinds of elements among Si, Ge, Sn, S, Se of Te as the N-type dopants for the N-type clad layer of the semiconductor light-emitting device in Example 3 are used, and the other construction is the same as Example 3. To dope the dopants Si, Ge, Sn, S, Se and Te, those as SiH$_4$ gas, GeH$_4$ gas, SnH$_4$ gas, H$_2$S gas, H$_2$Se gas and TeH$_4$ gas, respectively, each of which is diluted with H$_2$ to have a concentration of 100 ppm may be introduced into a reactive tube when the semiconductor is vapor deposited. At least two kinds, for example, S and Te among these gases are selected and introduced at a flow rate of about 10 sccm and about 10 sccm, respectively, into the reactive tube to allow the high temperature buffer layer 3 composed of the N-type GaN and the N-type clad layer 4 composed of the N-type Al$_x$Ga$_{x-1}$N to be vapor deposited.

According to this example, using the low electric resistance dopant S for the buffer layer and the dopant Te for the clad layer causes the PN junction to be hardly moved and the light emitting efficiency to be increased.

As with the above-mentioned Example 3, the dopant for the P-type Al$_x$Ga$_{x-1}$N layer as the P-type clad layer 6 may employ those used in Example 1, 2 or 5 instead of Mg as with conventional dopants.

EXAMPLE 7

Figure 2D:
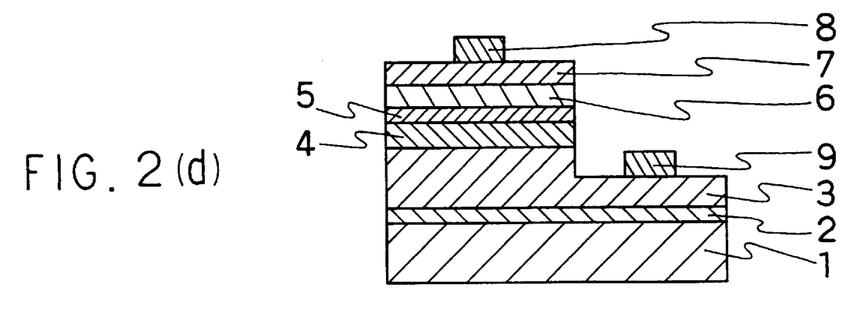

This example is characterized in that at least one of the N-type side electrode 9 and the P-type side electrode 8 (see FIG. 2(d)) of the semiconductor light-emitting is an alloy containing an element of the dopant in the gallium nitride type compound semiconductor layer in the N-type layer and the P-type layer to which the electrodes are connected, respectively.

For example, when Mg as the dopant of the P-type layer is used, an alloy of Mg with Au cannot be formed, and thus the electrodes must be used by combining Au, Ti, Ni, Pt and the like with each other. However, when Mg together with Zn as dopants are mixed into them, an alloy of Zn with Au can be produced, so that an ohmic contact with semiconductor layers is easily obtained.

EXAMPLE 8

Figure 1:
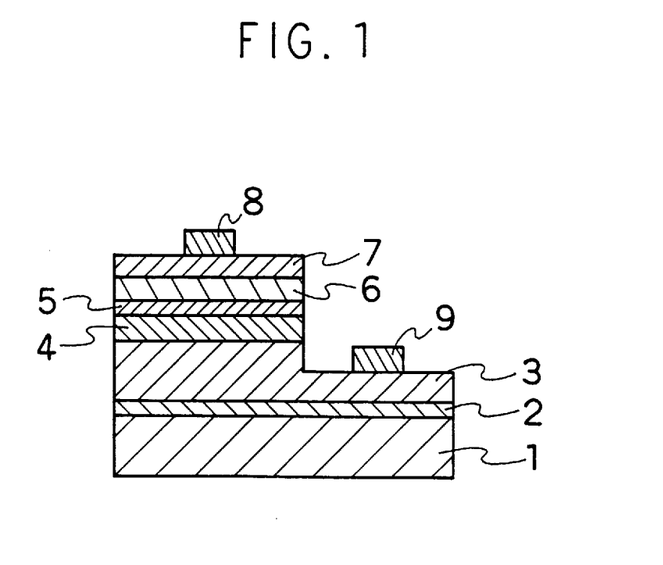
FIG. 1 is a cross-sectional illustrative view of an LED which is one example of a semiconductor light emitting device of the present invention.

FIG. 1 is a cross-sectional illustrative view of a semiconductor light emitting device of this example, in which the construction of laminated semiconductor layers is the same as in Examples 1 through 7. That is, reference numeral 1 designates a substrate composed of sapphire and the like, on which there are sequentially laminated the low temperature buffer layer 2 composed of N-type GaN by about 0.01 μm to about 0.2 μm, the high temperature buffer layer 3 composed of N-type GaN by about 2 μm to about 5 μm, the N-type clad layer 4 composed of N-type $Al_xGa_{x-1}N$ ($0 \leq x < 1$) by about 0.1 μm to about 0.3 μm, the active layer 5 composed of non-doped $GaN_{1-u}P_u$ ($0 < u < 0.2$) by about 0.05 μm to about 0.1 μm, the P-type clad layer 6 composed of P-type $Al_xGa_{x-1N}$ by about 0.1 μm to about 0.3 μm, and the cap layer 7 composed of P-type GaN by about 0.3 μm to about 2 μm. To make N-type layer, Si or Ge is doped, while to make P-type layer, Mg or Zn is doped. At least part of the cap layer 7, the P-type clad layer 6 and the active layer 5 of the laminated compound semiconductor layer is removed by measns of etching to form the N-type side electrode 9 and the P-type side electrode 8 on the high temperature buffer layer 3 as the exposed N-type layer and the cap layer 7 and the uppermost surface laminated P-type layer, respectively.

This example is characterized in that the compound semiconductor of the active layer 5 is made of $GaN_{1-u}P_u$, whereby the band gap energy is made smaller than that of the material of the clad layers 4 and 6, and at the same time, the compound semiconductor is made of $GaN_{1-u}P_u$ in which part of N is replaced with P. The ratio of P is selected in such a manner that the value of u preferably becomes 0.01 to 0.1, more preferably 0.02 to 0.05. This is because if the ratio of P is too large, the wavelength of emitted light becomes too long and the light emission from a deep level becomes large, while if the ratio of P is too small, the wavelength of emitted light does not become long enough to reach a target wavelength.

Replacing part of N with P causes the energy bandwidth to become small, thereby allowing the wavelength of emitted light to become longer. Although the larger the composition ratio of P is made, the longer the wavelength of emitted light can be made, the above-mentioned range is selected due to lattice constant or quality of the film as a crystal, so that the light emission of 490 nm to 520 nm as the wavelength of emitted light can be performed.

For the same reason as to replace part of N with P, even when part of N is replaced with As instead of P or together with P, the light emission with a longer wavelength is obtained as with the above case. Where instead of P, As is used, the ratio of As is selected preferabley to obtain a value of 0.005 atom % to 0.05 atom %, and more preferably to obtain a value of 0.01 atom % to 0.03 atom %. This is because if the ratio of As is too large, the wavelength of emitted light becomes too long and the light emission from a deep level becomes large, while if the ratio of As is too small, the wavelength of emitted light does not become long enough to reach a target wavelength. Also, in the case where part of N is replaced with both elements P and As, each percentage of P and As is preferably within the above-mentioned range.

Having explained the example of $GaN_{1-u}P_u$ as the active layer 5 in the above-mentioned Examples, even when not only replacing of part of N, but also replacing of part of Ga with In to form the semiconductor having a composition of $Ga_yIn_{1-y}N_{1-u}P_u$ ($0 < y \leq 1$, $0 < u < 0.2$), the band gap energy becomes small and the wavelength of emitted light can be made longer.

Further, having explained the example of a non-doped layer as the active layer 5 in the above-mentioned Examples, an impurity such as Mg, Zn, Cd, Be, Ca or Mn is doped to form the P-type layer, and an impurity such as Si, Se, S, Ge or Te is doped to form the N-type layer, whereby an energy level unique to the impurity is established in the energy band gap, and the recoupling of light emission through the level occurs, and for this reason, the wavelength of emitted light can be made longer. Of these impurities, particularly Be, Mn, Sc, Te the like are preferable because they can have a relatively deep level, thereby allowing the wavelength of emitted light to be made longer. Further, two or more kinds of impurities, for example, Zn and B, Mg and Mn, Si, and Te with Zn are mixed as impurities, thereby contributing to the light emission having longer wavelength more than addition. This is because when atomic concentration increases to some extent, the level can be established due to the interaction between combined atoms.

Also, according to the present invention, part of N of the gallium nitride type compound semiconductor is replaced with P and/or As to achieve a longer wavelength, so that the same effect as with the addition of In is obtained. However, the addition of P or As attains more lattice matching than the addition of In, so that the film thickness of the active layer can be made thick to contribute to an increased light emitting efficiency.

Further, in the above-mentioned Examples, having explained the buffer layers 2 and 3, and the cap layer 7 other than the active layer 5 by way of example GaN, and the clad layers 4 and 6 by way of example $Al_xGa_{x-1}N$, if the band gap energy of the clad layers 4 and 6 becomes larger than that of the active layer, the clad layers may have another composition, and the buffer layers 2 and 3 and the like may also comprise a gallium nitride type compound type semiconductor having a composition other than GaN.

The LED of this exmple is manufactured in the same manner as with Example 1. That is, as shown in FIG. 2(*a*), the substrate 1 composed of sapphire and the like is supplied with trimethyl gallium (hereinafter called TMG) as an organometallic compound gas, $NH_3$ and $SiH_4$, $GeH_4$, $TeH_4$ and the like as a dopant together with carrier gas $H_2$ by means of MOCVD method to deposit the low temperature buffer layer 1 composed of a gallium nitride type semiconductor layer such as the N-type GaN layer at 400° C. to 700° C. and a high temperature buffer layer 3 at 700° C. to 1200° C. by 0.01 μm to 0.2 μm and 2 to 5 μm, respectively.

Then, trimethyl aluminium (hereinafter called TMA) is added to the above-mentioned gas to form the N-type clad layer 4 containing Si, Ge, Te and the like as the N-type dopant by about 0.1 μm to about 0.3 μm.

Then, instead of the above-mentioned raw gas TMA, tertiary butylphosphine (hereinafter called TBP) is introduced to form the active layer 5, as a light emitting layer, composed of a material the band gap energy of which becomes smaller than that of the clad layer 4, for example, $GaN_{1-u}P_u$ by about 0.05 μm to about 0.1 μm. Changing the active layer has allowed the wavelength A of emitted light to be changed from 495 μm to 520 μm.

Further, using the same raw gas as used to form the N-type clad layer 4, biscycropentadienel magnesium (hereinafter called $Cp_2Mg$) or dimethyl zinc (hereinafter called DMZn) for Mg or Zn as a P-type impurity as an impurity raw gas instead of $SiH_4$ is introduced into a reactive tube to allow a P-type $Al_xGa_{x-1}N$ layer as the P-type clad layer 6 to be vapor deposited.

Then, to form the cap layer 7, using the same gas as for the above-mentioned buffer layer 3, $Cp_2Mg$ or DMZn as an impurity raw gas is supplied to allow a P-type GaN layer to be deposited to a thickness of about 0.3 μm to about 1 μm. The cap layer 7 is used to reduce the contact resistance between an electrode and a semiconductor layer.

Thereafter, the process of FIGS. 2(b) through 2(d) is performed in the same manner as with Example 1.

In depositing the above-mentioned active layer 5, the depositing of $GaN_{1-v}As_v$ (0<v<1) is obtained by introducing tertiary butylphosphine (hereinafter called TBP) gas instead of the above-mentioned TBP; the depositing of $Ga_yIn_{1-y}N_{1-u}P_u$ (0<y<1, 0<u<1) is obtained by introducing further TMI into the above-mentioned gas; and the depositing of $Ga_yIn_{1-y}N_{1-v}As_v$ (0<y<1, 0<v<1) is obtained by introducing TMI into the above-mentioned $N_{1-v}As_v$ raw gas.

Also, the doping of an impurity into the active layer 5 is obtained by introducing further a raw gas of the impurity into a raw gas for depositing the above-mentioned active layer 5.

EXAMPLE 9

Figure 3:
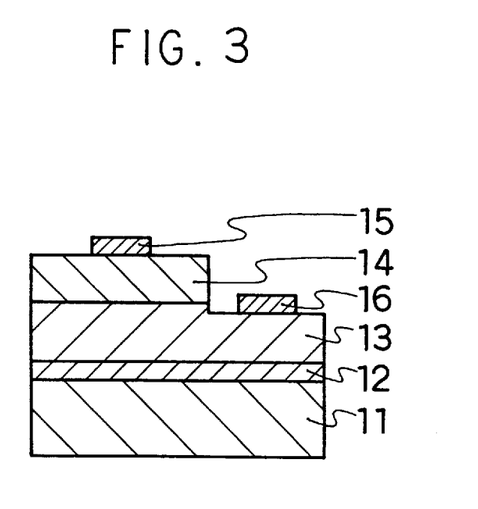
FIG. 3 is a cross-sectional illustrative view of an LED which is another example of a semiconductor light emitting device of the present invention.

FIG. 3 is a cross-sectional illustrative view of another example of a semiconductor light emitting of the present invention. This example shows an LED having PN junction instead of the double heterojunction in the above-mentioned Example 8, and the method of depositing a gallium nitride compound semiconductor layer and the change in composition are the same as with the above-mentioned Example 8.

In FIG. 3, formed on a sapphire (single crystal of $Al_2O_3$) 11 is, for example, a low-temperature buffer layer 12 composed of the N-type GaN and the like by about 0.01 μm to about 0.2 μm at a low temperature of 400° C. to 700° C.; formed on which layer 12 is an N-type layer 13 composed of the N-type $GaN_{1-u}P_u$ and the like and into which Si and the like are doped at a high temperature of 700° C. to 1200° C.; further formed on which layer 13 is a P-type layer 14 composed of the P-type $GaN_{1-u}P_u$ and the like and into which Mg and the like are doped, so that homo PN junction composed of $GaN_{1-u}P_u$ is formed. Provided on the P-type layer 14 is a P-type side electrode 15 composed of Au, Al and the like; and provided on the N-type layer 13 exposed by removing of part of the P-type layer 14 by means of etching is an N-type side electrode 16, so that an LED having a PN junction is formed.

Also, this example may employ a compound semiconductor layer having another composition such as $GaN_{1-v}As_v$, $Ga_yIn_{1-y}N_{1-u}P_u$ and $Ga_yIn_{1-y}N_{1-v}As_v$ instead of $GaN_{1-u}P_u$. The essential thing is that the composition of the semiconductor contributing to the light emitting layer is made changed such that part of N of the gallium nitride type compound semiconductor is replaced with P and/or As, whereby a semiconductor light emitting device for emitting a light having a longer wavelength is obtained.

Also, having explained LED in the above-mentioned each example, the present invention can be also applied to various semiconductors including semiconductor laser other than LED.

According to the semiconductor light emitting device of the present invention, by selecting dopants for a gallium nitride type compound semiconductor, carrier concentration can be made high, so that the electric resistance becomes lower and thus a light with the same luminance as used conventionally can be emitted at a voltage lower than used conventionally. That is, applying the same voltage as used conventionally allows a higher luminance to be obtained.

Also, by making the dopant an element heavier than Mg or Si, the junction position of PN junction is hardly moved and thus a semiconductor light emitting device such as LED and LD can be obtained which has a stable light emitting position and a higher reliability.

Further, electrode material can be matched with dopant; the contact resistance between the N-type layer or the P-type layer and the electrode metal can be made lower; and a semiconductor light emitting having an improved light emitting efficiency can be obtained.

According to the semiconductor light emitting device of the present invention, by adding P or As to the light emitting layer of the semiconductor light emitting device composed of a gallium nitride type compound semiconductor, a light emitting element having a wider wavelength of emitted light width can be obtained and thus a light emitting device having a higher product value can be obtained. Also, in comparison to a case where In is added, lattice mismatching is smaller, so that the film thickness of the light emitting layer can be made thicker, thereby allowing an increased light emitting efficiency, as well as a higher luminance.

Though several embodiments of the present invention are described above, it is to be understood that the present invention is not limited only to the above-mentioned, and various changes and modifications may be made in the invention without departing from the spirit and scope thereof.

What is claimed is:

1. A semiconductor light emitting device comprising:

a substrate;

gallium nitride type compound semiconductor layers provided on the substrate, said semiconductor layers including at least an N-type layer and a P-type layer; a wherein at least a light emitting layer of said gallium nitride compound semiconductor layers is composed of a compound semiconductor in which part of the nitrogen in the gallium nitride type compound semiconductor is replaced with phosphorous and/or arsenic, wherein the gallium nitride type compound semiconductor layers laminated on said substrate have both N-type and P-type clad layers, and an active layer is composed of a material which is provided between both the clad layers and which has a band gap energy smaller than that of both the clad layers, said active layer comprising a compound semiconductor in which part of the nitrogen in the gallium nitride type compound semiconductor is replaced with phosphorus and/or arsenic, wherein said active layer comprises a compound semiconductor in which part of the gallium in the gallium nitride type compound semiconductor is replaced with In.

2. A semiconductor light emitting device comprising:

a substrate;

gallium nitride type compound semiconductor layers provided on the substrate, said semiconductor layers including at least an N-type layer and a P-type layer;

wherein at least a light emitting layer of said gallium nitride compound semiconductor layers is composed of a compound semiconductor in which part of the nitrogen in the gallium nitride type compound semiconductor is replaced with phosphorous and/or arsenic;

wherein the gallium nitride type compound semiconductor layers laminated on said substrate have both N-type and P-type clad layers, and an active layer is composed of a material which is provided between both the clad layers and which has a band gap energy smaller than that of both the clad layers, said active layer comprising a compound semiconductor in which part of the nitrogen in the gallium nitride type compound semiconductor is replaced with phosphorus and/or arsenic, wherein at least one kind of dopant selected from a group composed of Mg, Zn, Cd, Be, Ca, Mn, Si, Se, S, Ge and Te is doped in said active layer.

3. The semiconductor light emitting device as set forth in claim 2, wherein an N-type dopant and a P-type dopant having the same amount are added to said active layer.

4. A semiconductor light emitting device comprising:

a substrate;

gallium nitride type compound semiconductor layers provided on the substrate, said semiconductor layers including at least an N-type layer and a P-type layer;

wherein at least a light emitting layer of said gallium nitride compound semiconductor layers is composed of a compound semiconductor in which part of the nitrogen in the gallium nitride type compound semiconductor is replaced with phosphorous and/or arsenic, wherein the gallium nitride type compound semiconductor layers laminated on said substrate have a junction plane of an N-type layer and a P-type layer, said N-type layer and/or P-type layer being a compound semiconductor in which part of the nitrogen in the gallium nitride type compound semiconductor is replaced with phosphorus and/or arsenic.

5. The semiconductor light emitting device as set forth in claim 4, wherein said N-type layer and P-type layer comprise compound semiconductors in which part of the gallium in the gallium nitride type compound semiconductor is replaced with Indium.

6. A semiconductor light emitting device comprising:

a substrate;

gallium nitride type compound semiconductor layers provided on the substrate, said semiconductor layers including at least an N-type layer and a P-type layer;

wherein at least a light emitting layer of said gallium nitride compound semiconductor layers is composed of a compound semiconductor in which part of the nitrogen in the gallium nitride type compound semiconductor is replaced with phosphorous and/or arsenic, wherein the impurity of said P-type layer is at least two kinds of mixed elements selected from a group composed of Mg, Zn, Cd, Be and Mn.

7. A semiconductor light emitting device comprising:

a substrate;

gallium nitride type compound semiconductor layers provided on the substrate, said semiconductor layers including at least an N-type layer and a P-type layer;

wherein at least a light emitting layer of said gallium nitride compound semiconductor layers is composed of a compound semiconductor in which part of the nitrogen in the gallium nitride type compound semiconductor is replaced with phosphorous and/or arsenic, wherein the impurity of said N-type layer is at least two kinds of mixed elements selected from a group composed of Si, Ge, Sn, S, Se, and Te.

8. A semiconductor light emitting device comprising:

a substrate;

gallium nitride type compound semiconductor layers provided on the substrate, said semiconductor layers including at least an N-type layer and a P-type layer;

wherein at least a light emitting layer of said gallium nitride compound semiconductor layers is composed of a compound semiconductor in which part of the nitrogen in the gallium nitride type compound semiconductor is replaced with phosphorous and/or arsenic, wherein the N-type side and/or the P-type side electrode connected to said N-type layer and P-type layer, respectively, are an alloy containing at least one kind of an element of dopants of the N-type layer and the P-type layer, respectively, connected to said N-type side and/or P-type side electrode.

* * * * *